United States Patent
Phoon et al.

(10) Patent No.: US 7,304,496 B2
(45) Date of Patent: Dec. 4, 2007

(54) MASK-PROGRAMMABLE LOGIC DEVICE WITH PROGRAMMABLE INPUT/OUTPUT PORTS

(75) Inventors: Hee Kong Phoon, Perak (MY); Kian Chin Yap, Penang (MY)

(73) Assignee: Altera Corporation, San Jose, CA (US)

( * ) Notice: Subject to any disclaimer, the term of this patent is extended or adjusted under 35 U.S.C. 154(b) by 97 days.

(21) Appl. No.: 11/117,588

(22) Filed: Apr. 28, 2005

(65) Prior Publication Data

US 2006/0279324 A1 Dec. 14, 2006

(51) Int. Cl.
*H03K 19/173* (2006.01)
*H03K 19/00* (2006.01)

(52) U.S. Cl. .............................. 326/38; 326/37; 326/47; 326/101

(58) Field of Classification Search .................... 326/38
See application file for complete search history.

(56) References Cited

U.S. PATENT DOCUMENTS

| 5,656,548 | A | * | 8/1997 | Zavracky et al. | 438/23 |
| 5,742,181 | A | * | 4/1998 | Rush | 326/41 |
| 6,222,212 | B1 | * | 4/2001 | Lee et al. | 257/207 |
| 6,331,790 | B1 | * | 12/2001 | Or-Bach et al. | 326/41 |
| 7,084,666 | B2 | * | 8/2006 | Madurawe | 326/38 |

* cited by examiner

*Primary Examiner*—Rexford Barnie
*Assistant Examiner*—Thienvu Tran
(74) *Attorney, Agent, or Firm*—Ropes & Gray LLP; Jeffrey H. Ingerman

(57) ABSTRACT

A mask-programmable logic device includes a macrocell having an external input/output port for "place-and-route" programming by addition of metallization layers. A programmable "fixed" layer allows the external input/output port to be isolated from the remainder of the macrocell so that it "floats," allowing signals to be routed through the external input/output port when the macrocell is not in use, to reduce routing blockages. The macrocell also may have at least one internal input/output port, potentially connected to different logic circuits, and a programmable "fixed" layer that can be used to control which internal input/output port is connected to the external input/output port. By thus allowing multiple logic circuits to share a single external input/output port, routing blockages are reduced.

18 Claims, 3 Drawing Sheets

MASK-PROGRAMMABLE LOGIC DEVICE WITH PROGRAMMABLE INPUT/OUTPUT PORTS

BACKGROUND OF THE INVENTION

This invention relates to mask-programmable logic devices having both fixed and programmable layers, where the input/output ("I/O") ports are located in the fixed layers but are programmable.

Programmable logic devices are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements each time that the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic elements in the device, and the interconnect for routing of signals between the logic elements, were programmable. More recently, mask-programmable logic devices have been provided. With mask-programmable logic devices, instead of selling all users the same device, the manufacturer manufactures a partial device with a standardized arrangement of logic elements whose functions are not programmable by the user, and which lacks any routing or interconnect resources.

The user provides the manufacturer of the mask-programmable logic device with the specifications of a desired device, which may be the configuration file for programming a comparable conventional programmable logic device. The manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

While conventional programmable logic devices allow a user to easily design a device to perform a desired function, a conventional programmable logic device invariably includes resources that may not be used for a particular design. Moreover, in order to accommodate general purpose routing and interconnect resources, and the switching resources that allow signals from any logic element to reach any desired routing and interconnect resource, conventional programmable logic devices grow ever larger as more functionality is built into them, increasing the size and power consumption of such devices. The routing of signals through the various switching elements as they travel from one routing and interconnect resource to another also slows down signals.

The advent of mask-programmable logic devices has allowed users to prove a design in a conventional programmable logic device, but to commit the production version to a mask-programmable logic device which, for the same functionality, can be significantly smaller and use significantly less power, because the only interconnect and routing resources are those actually needed for the particular design. In addition, those resources are simple metallizations, so there are no general purpose switching elements consuming space or power, or slowing down signals.

A more recent generation of mask-programmable logic devices is not directly based on comparable conventional programmable logic devices by the same manufacturer. For example, one such device is shown in copending, commonly-assigned U.S. patent application Ser. No. 10/316,237, filed Dec. 9, 2002 and hereby incorporated herein by reference in its entirety, includes a plurality of more elementary logic areas that can be connected together to provide the functionality of a conventional programmable logic device. Such devices have the advantage of not having to replicate structures that may not be used in a particular user logic design. Instead, they are provided with resources sufficient to create the same logic design as a convention programmable logic device to which it may be considered an equivalent.

Regardless of its particular type, a mask-programmable logic device typically has a number of fixed layers including fixed semiconductor layers and fixed metallization layers, with provisions for one or more programming metallization layers to be added to implement a customer's user logic design. Among the structures in the fixed layers are I/O ports, which may or may not be used in a particular user logic design.

It is axiomatic that a particular mask-programmable logic device, like a conventional programmable logic device, can only accommodate a user logic design of a certain size. A larger device would be required to accommodate larger designs. However, in most cases, when the limit of the size of the user logic design is reached, it is reached because all of a particular type of resource—either a routing or logic resource—has been used, even though there may other types of resources on the device that remain unused. For example, it may not be possible to route the user design with the available routing resources, while at the same time some of the aforementioned I/O ports remain unused.

It would be desirable to be able to maximize the amount of a mask-programmable logic device that can be used in a user logic design, and thereby maximize the size of user logic design that can be accommodated in a particular device.

SUMMARY OF THE INVENTION

The present invention relies on at least one of the "fixed" layers of a mask-programmable logic device that frequently provides some programmability as between or among a small number of alternative functions. In accordance with this invention, such layer or layers are used to configure the I/O port of a macrocell or other logic grouping. The layer may be a metallization layer in which programmable connections (e.g., fuses) are used to make or break connections between segments of the layer, or a semiconductor layer in which programmable vias may be used to make or break connections between metallization layers on either side of the semiconductor layer.

In a device according to the invention, a macrocell has a place-and-route port (sometimes referred to herein, and in the claims that follow, as an "external" port) and one or more internal ports. For example, different internal ports may connect to different groups of logic circuitry. Whichever of those functions is selected for use in the user logic design, the corresponding internal port would be connected to the place-and-route port for routing via the programming metallization layers to other parts of the device or to an external pin of the device. Alternatively, two or more groups of logic circuitry may be used in parallel to, e.g., increase drive strength (in a case of increasing drive strength, each group would be programmed with the same function).

In accordance with the invention, the ports (both internal and external) are arranged so that, depending on how the programmable layer is programmed, the external port can be isolated. This allows the external port to become a floating port, so that an unused port does not create a routing blockage. Also, the ports are arranged so that more than one internal port can be connected to the external port. This allows several different internal ports to share a single external port. The ability of more than one internal port to be connected to a single external port increases routability (reduces blockages), and also facilitates parallel connection of two groups of logic circuitry to the external port in those cases where that is desired. Another possibility is that two logic circuits that share an external port can communicate with one another via the shared port, without requiring routing via the programming metallization layers.

Finally, because the external port can be isolated in the fixed layers, the via layer above the external ports, which heretofore has been considered a programming layer, can be made fixed, if desired. There may be no need to be able to control the vias between the external ports and the programming metallization, because the external ports can be disconnected at their opposite ends.

Thus, in accordance with the present invention there is provided a mask-programmable logic device including a plurality of base semiconductor layers and a plurality of base metallization layers. The base semiconductor layers and the base metallization layers when connected to at least one additional metallization layer form a plurality of logic units. Each of at least two of said logic units comprises an internal input/output port. The mask-programmable logic device further comprises at least one external input/output port configured for connection to at least one of the logic units and configured for connection to one of the additional metallization layers. At least one layer in the plurality of base semiconductor layers and the plurality of base metallization layers is programmable to control connection between the at least one internal input/output port and the at least one external input/output port. The plurality of base semiconductor layers and the plurality of base metallization layers are configured for at least one of (a) programmable isolation of the external input/output port, (b) programmable connection of the external input/output port to at least one the internal input/output ports of the at least two logic units, and (c) programmable interconnection of the input/output ports of the at least two logic units.

A device as programmed, by programming the programmable base layer and adding programming metallization, is also provided, as is a method of programming by programming the programmable base layer and adding the programming metallization.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 3 is a diagrammatic cross-sectional representation of a first embodiment of a macrocell in a mask-programmable logic device in accordance with the present invention, with representative programming layers;

FIG. 4 is a diagrammatic cross-sectional representation of a second embodiment of a macrocell in a mask-programmable logic device in accordance with the present invention, with representative programming layers;

DETAILED DESCRIPTION OF THE INVENTION

The invention will now be described with reference to FIGS. 1-6.

Figure 1:
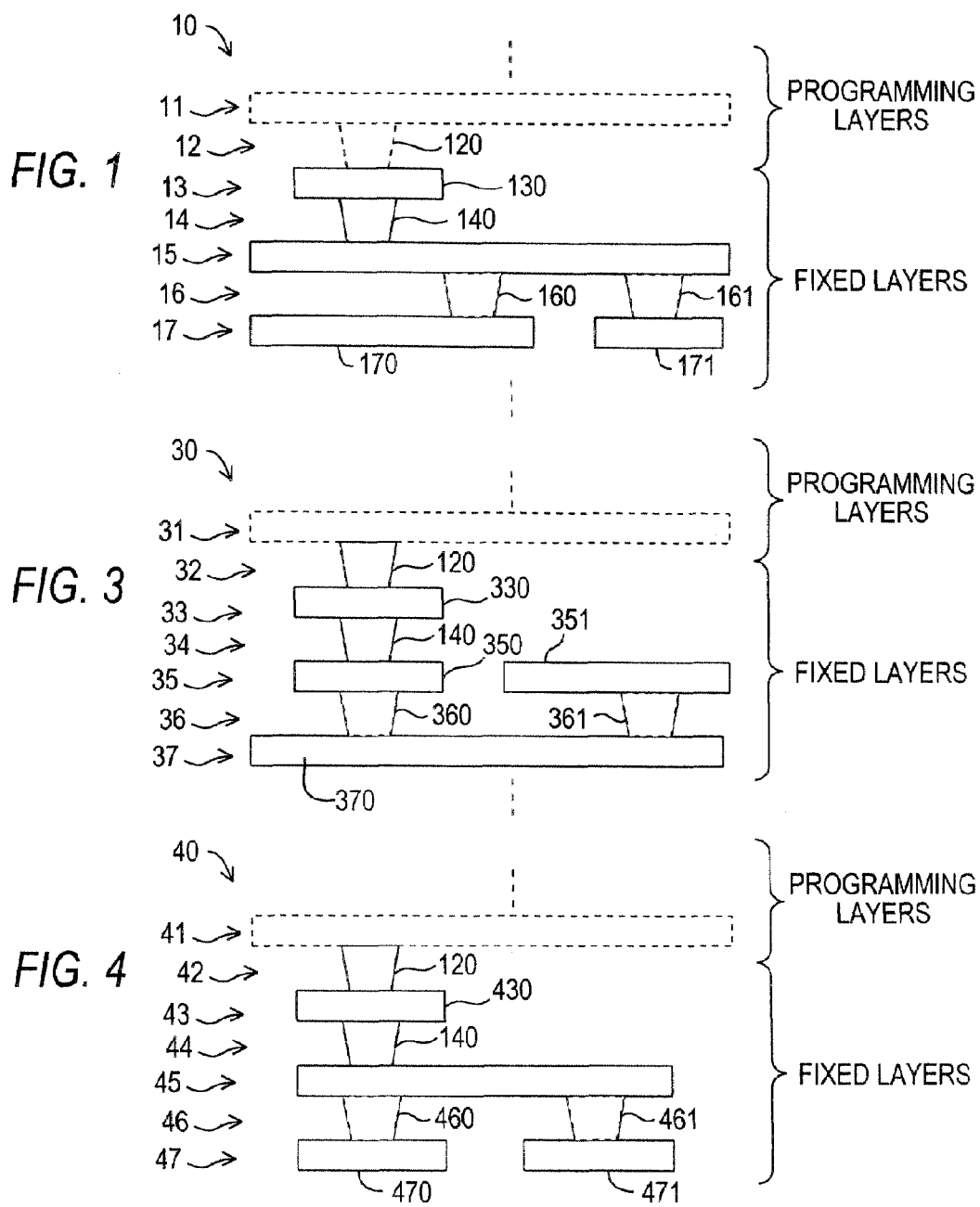
FIG. 1 is a diagrammatic cross-sectional representation of a first embodiment of a macrocell in a known mask-programmable logic device with representative programming layers.

FIG. 1 shows one embodiment of a known mask-programmable logic device 10 having seven layers 11-17. Layers 11, 13, 15 and 17 are metal layers, while layers 12, 14 and 16 are semiconductor layers including vias 120, 140, 160 and 161. Layers 13-17 preferably are "fixed" layers representing the base mask-programmable device 10, while layers 11 and 12 preferably represent programming layers. Preferably, although most programming is provided by connections established by layers 11 and 12, some programming preferably also is accomplished by programming "fixed" layer 16, which preferably contains at least some programmable vias 160, 161. In addition, while only two programming layers 11, 12 are shown, there could be additional programming layers. Similarly, there could be additional fixed layers (not shown) beyond layers 13-17. Programmable structures are shown in phantom. Thus, in this example, all of metallization layer 11 is shown in phantom, while via 120 of layer 12 and vias 160, 161 of layer 16 also are shown in phantom.

In device 10, metal structure 130 in layer 13 preferably is a "place-and-route" or "external" port as discussed above. In this device, metal layer 15 is substantially continuous, meaning that if there are any signals in any portion of any logic circuitry (e.g., connected to structures 170, 171) connected to metal layer 15, which may be considered an internal port, it will be conducted to external port 130. Thus, the only way to prevent signals from being propagated through port 130 would be to not program via 120 to conduct, or to etch away layer 11 from the area above port 130.

Figure 2:
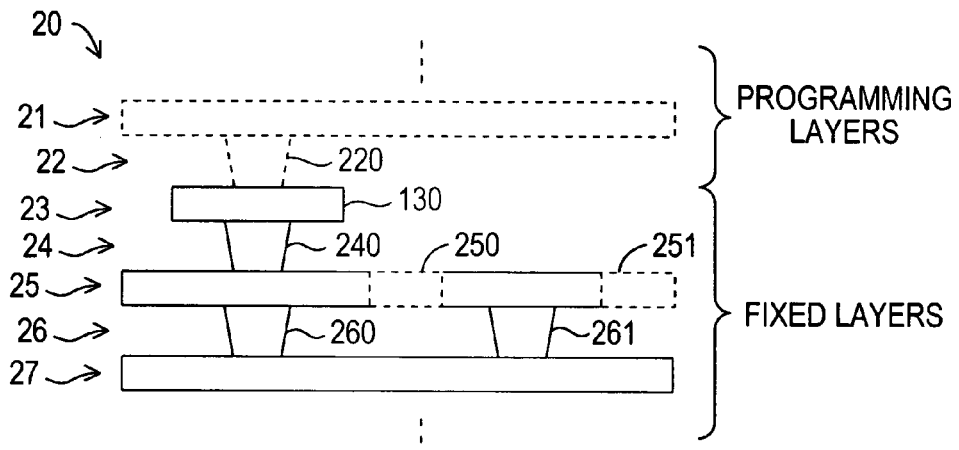
FIG. 2 is a diagrammatic cross-sectional representation of a second embodiment of a macrocell in a known mask-programmable logic device with representative programming layers.
Figure 5:
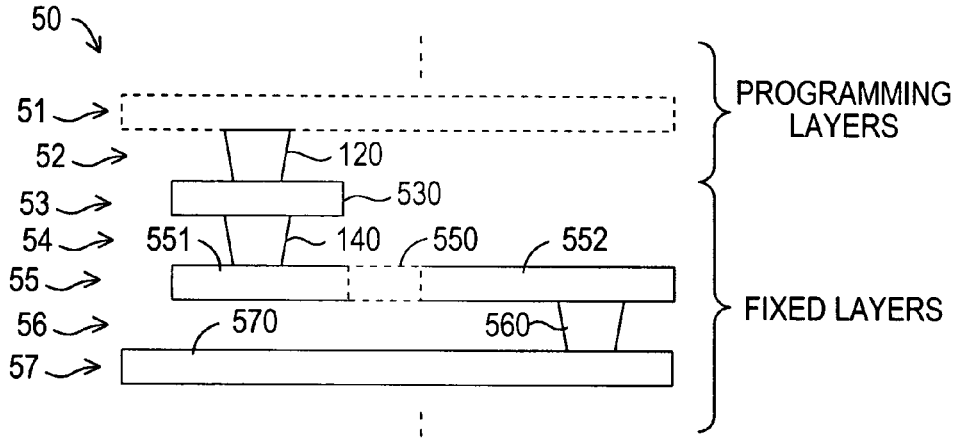
FIG. 5 is a diagrammatic cross-sectional representation of a third embodiment of a macrocell in a mask-programmable logic device in accordance with the present invention, with representative programming layers.
Figure 6:
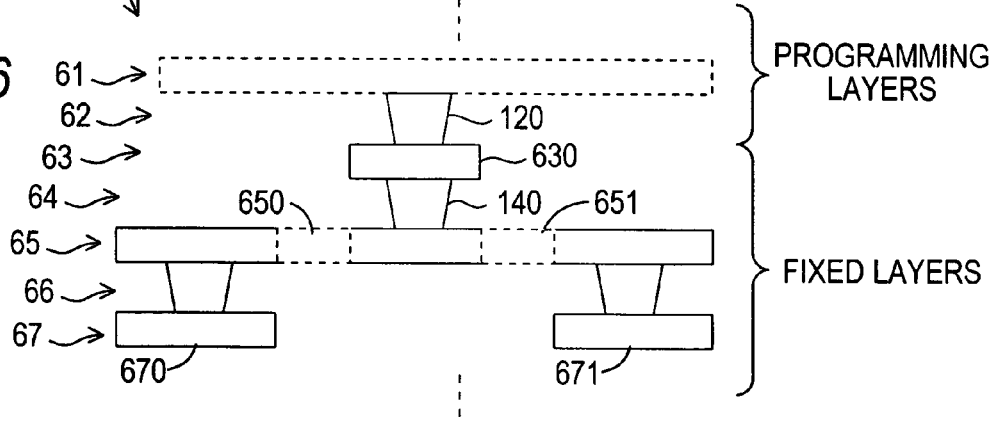
FIG. 6 is a diagrammatic cross-sectional representation of a fourth embodiment of a macrocell in a mask-programmable logic device in accordance with the present invention, with representative programming layers.

FIG. 2 shows another embodiment of a known mask-programmable logic device 20 having seven layers 21-27. Layers 21, 23, 25 and 27 are metal layers, while layers 22, 24 and 26 are semiconductor layers including vias 220, 240, 260 and 261. Layers 23-27 preferably are "fixed" layers representing the base mask-programmable device 20, while layers 21 and 22 preferably represent programming layers. Preferably, although most programming is provided by connections established by layers 21 and 22, some programming preferably also is accomplished by programming "fixed" layer 25, which preferably contains at least some programmable connections 250, 251. For example, connections 250, 251 may be fuses that can be blown to program device 20.

FIG. 3 shows a first embodiment of a mask-programmable logic device 30 in accordance with the present invention. In this embodiment, as compared to FIG. 1, structures 170, 171 in bottom layer 17 of device 10 have been replaced by structures 350, 351 in layer 35, just below external port 330 (separated therefrom by semiconductor layer 34). Only one of structures 350, 351 is connected to external port 330, while both are connectable by programmable vias 360, 361 to internal port 370. In this embodiment, if it desired to isolate external port 330, that can be accomplished by not programming via 360 to conduct.

A second embodiment of a mask-programmable logic device 40 in accordance with the present invention, shown in FIG. 4, is similar to FIG. 1. Structures 170, 171 in bottom layer 17 of device 10 have been replaced by structures 470, 471 in layer 47, and may serve as internal ports for logic circuitry provided elsewhere in those layers or in layers that are not shown. Internal ports 470, 471 may share external port 430 through metal layer 45, by programming appropriate one of vias 460, 461 to conduct, so that the desired one, or both, of internal ports 470, 471 is connected to external port 430. Also, in this embodiment, external port 430 may be isolated by programming both of vias 460, 461 not to conduct.

Because in embodiments 30 and 40 the external port can be isolated without regard to the programming layers, layer 32, 42 can be made fixed, rather than programmable like layers 12 and 22. Only layer 31, 41 (and possibly other layers not shown) may be programmable. This can represent a cost savings to the user at the stage when the programming layers are applied to implement a user logic design. However, layer 42 may nevertheless be made programmable, so that internal ports 470, 471 can be connected to each other without connecting to external port 430, to bypass the general routing structure of the device. Alternatively, if layer 42 is not programmable, layer 41 could be etched away (or never deposited) over external port 430.

Embodiment 50 is similar to embodiment 30 in that external port 530 (layer 53) can be isolated, in this case by opening connection 550 in layer 55, so that portion 551 of layer 55 is not connected to portion 552, which is connected by conductive via 560 (layer 56) to internal port 570 (layer 57). Embodiment 60 is similar to embodiment 40 in that either or both of internal ports 670, 671 (layer 67) can be connected, or not, to external port 630 (layer 63), by programming connections 650, 651 (layer 65) to conduct or not so that appropriate internal port is connected to external port 630. As above, layer 52 or 62 can be made fixed without sacrificing programmability in these embodiments. However, layer 62 may nevertheless be made programmable, so that internal ports 670, 671 can be connected to each other without connecting to external port 630, to bypass the general routing structure of the device. Alternatively, if layer 62 is not programmable, layer 61 could be etched away (or never deposited) over external port 630.

As stated above, the present invention improves routability. Thus, if macrocell 30 or 50 is not being used and respective external port 330 or 530 would otherwise cause a routing blockage, it can be isolated using programmable layer 36 or 55 so that signals that otherwise would be blocked can simply propagate through it. This allows layer 32 or 52 to be fixed and saves programming costs, as discussed above. Similarly, routability is improved in macrocell 40 or 60 by giving two different logic functions access to external port 430 or 630 by appropriate programming of layer 46 or 65. The two functions can be the same, to increase external drive strength, or the two functions could use this connection to communicate with one another.

Figure 7:
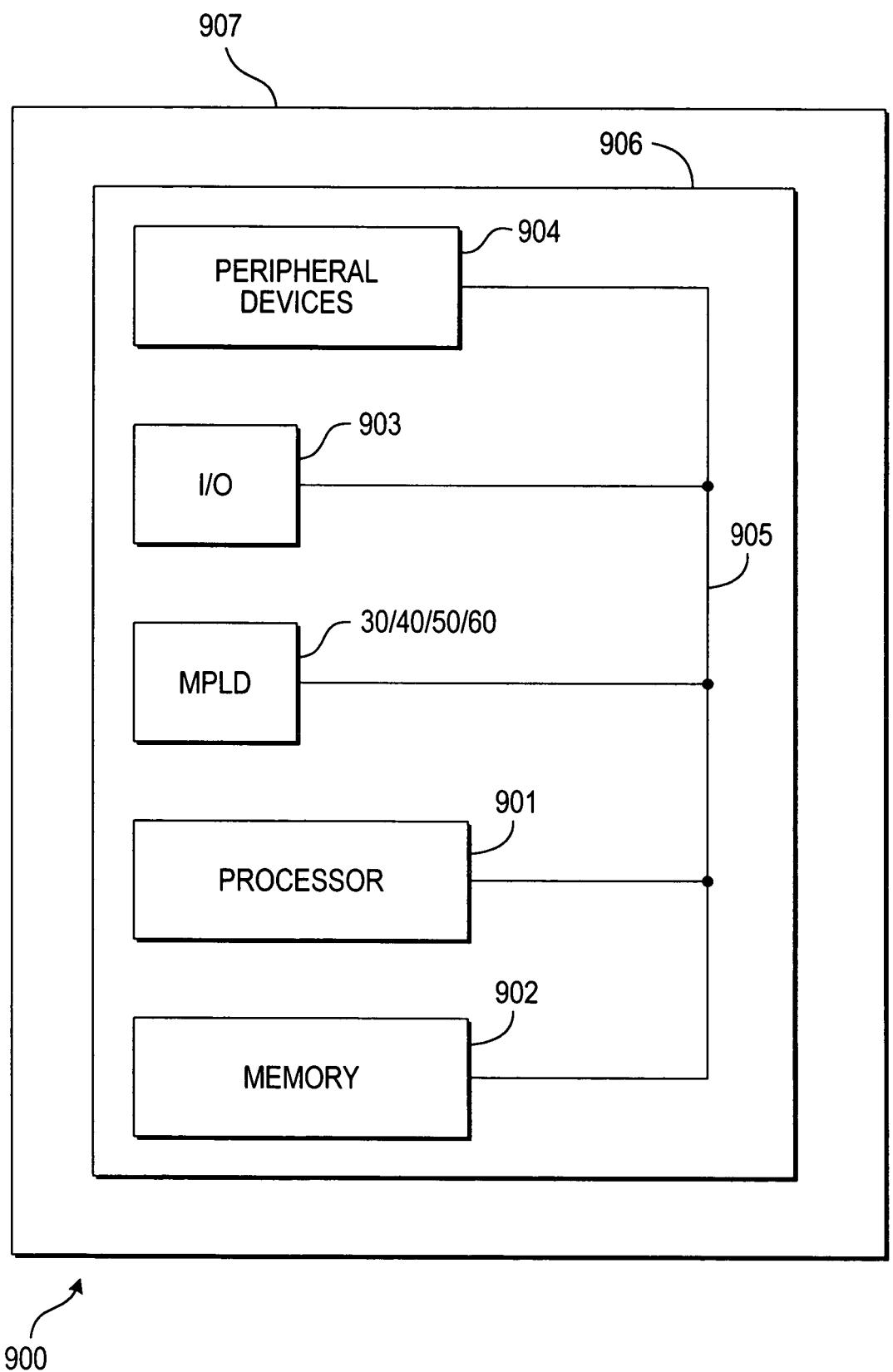
FIG. 7 is a simplified block diagram of an illustrative system employing a programmed mask-programmable logic device in accordance with the present invention.

Mask-programmable logic device (MPLD) 30, 40, 50 or 60 according to the present invention may be used in many kinds of electronic devices. One possible use is in a data processing system 900 shown in FIG. 7. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. MPLD 30, 40, 50 or 60 can be used to perform a variety of different logic functions. For example, MPLD 30, 40, 50 or 60 can be configured as a processor or controller that works in cooperation with processor 901. MPLD 30, 40, 50 or 60 may also be used as an arbiter for arbitrating access to a shared resources in system 900. In yet another example, MPLD 30, 40, 50 or 60 can be configured as an interface between processor 901 and one of the other components in system 900. It should be noted that system 900 is only exemplary, and that the true scope and spirit of the invention should be indicated by the following claims.

Various technologies can be used to implement MPLDs 30, 40, 50 or 60 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A mask-programmable logic device comprising:
   a plurality of base semiconductor layers; and
   a plurality of base metallization layers; wherein:
   said base semiconductor layers and said base metallization layers when connected to at least one additional metallization layer form a plurality of logic units;
   each respective one of at least two of said logic units comprises a first metallization structure forming an internal input/output port within said respective logic unit and a second metallization structure forming an external input/output port within said respective logic unit;

said external input/output port is configured for connection to one said additional metallization layer; and at least one layer in said plurality of base semiconductor layers and said plurality of base metallization layers is configured to programmably control connection between said internal input/output ports and said external input/output ports, to provide all of (a) programmable isolation of each respective one of said external input/output ports from its respective logic unit, (b) programmable connection of said external input/output port of a respective one of said logic units to said internal input/output port of said respective logic unit, (c) programmable connection of said external input/output port of a respective one of said logic units to said internal input/output port of another one of said logic units for use of said external input/output port of said respective one of said logic units by said another one of said logic units, and (d) programmable interconnection of said internal input/output ports of said at least two logic units for sharing of said external input/output port of one of said at least two logic units by all of said at least two logic units.

2. The mask-programmable logic device of claim 1 wherein said at least one layer that is programmable is one of said base semiconductor layers.

3. The mask-programmable logic device of claim 1 wherein said at least one layer that is programmable is one of said base metallization layers.

4. The mask-programmable logic device of claim 1 wherein said at least one layer that is programmable is programmable to isolate said external input/output port from said internal input/output port.

5. The mask-programmable logic device of claim 1 wherein:

one of said external input/output ports is connectable to at least two of said internal input/output ports; and said at least one layer that is programmable is programmable to connect said external input/output port to one of said at least two internal input/output ports.

6. The mask-programmable logic device of claim 5 wherein said at least one layer is programmable to connect said external input/output port to both of said at least two internal input/output ports.

7. A programmed mask-programmable logic device comprising:

a plurality of base semiconductor layers;

a plurality of base metallization layers; and at least one additional metallization layer applied to said base layers to form at least one of (a) logic units and (b) connections among logic units; wherein:

each respective one of at least two of said logic units comprises a first metallization structure forming an internal input/output port within said respective logic unit and a second metallization structure forming an external input/output port within said respective logic unit;

said external input/output port is configured for connection to one said additional metallization layer; and at least one layer in said plurality of base semiconductor layers and said plurality of base metallization layers is configured to programmably control connection between said internal input/output ports and said at least one external input/output ports, to provide all of (a) programmable isolation of each respective one of said external input/output ports from its respective logic unit, (b) programmable connection of said external input/output port of a respective one of said logic units to said internal input/output port of said respective logic unit, (c) programmable connection of said external input/output port of a respective one of said logic units to said internal input/output port of another one of said logic units for use of said external input/output port of said respective one of said logic units by said another one of said logic units, and (d) programmable interconnection of said internal input/output ports of said at least two logic units for sharing of said external input/output port of one of said at least two logic units by all of said at least two logic units.

8. The programmed mask-programmable logic device of claim 7 wherein said at least one layer that is programmable is one of said base semiconductor layers.

9. The programmed mask-programmable logic device of claim 7 wherein said at least one layer that is programmable is one of said base metallization layers.

10. The programmed mask-programmable logic device of claim 7 wherein said at least one layer that is programmable is programmed to isolate said external input/output port from said internal input/output port.

11. The programmed mask-programmable logic device of claim 7 wherein:

one of said external input/output ports is connectable to at least two of said internal input/output ports; and said at least one layer that is programmable is programmed to connect said external input/output port to one of said at least two internal input/output ports.

12. The mask-programmable logic device of claim 11 wherein said at least one layer is programmable to connect said external input/output port to both of said at least two internal input/output ports.

13. A method for programming a mask-programmable logic device comprising:

a plurality of base semiconductor layers, and a plurality of base metallization layers, wherein:

said base semiconductor layers and said base metallization layers when connected to at least one additional metallization layer form a plurality of logic units, each respective one of at least two of said logic units comprises a first metallization structure forming an internal input/output port within said respective logic unit and a second metallization structure forming an external input/output port within said respective logic unit, said external input/output port is configured for connection to one said additional metallization layer, and at least one layer in said plurality of base semiconductor layers and said plurality of base metallization layers is configured to programmably control connection between said internal input/output ports and said external input/output ports, to provide all of (a) programmable isolation of each respective one of said external input/output ports from its respective logic unit, (b) programmable connection of said external input/output port of a respective one of said logic units to said internal input/output port of said respective logic unit, (c) programmable connection of said external input/output port of a respective one of said logic units to said internal input/output port of another one of said logic units for use of said external input/output port of said respective one of said logic units by said another one of said logic units, and (d) programmable interconnection of said internal input/output ports of said at least two logic units for sharing of said external input/output port of one of said at least two logic units by all of said at least two logic units, said method comprising:

applying at least one said additional metallization layer; and programming said at least one base layer that is programmable.

14. The method of claim 13 wherein said programming comprises programming one of said base semiconductor layers.

15. The method of claim 13 wherein said programming comprises programming one of said base metallization layers.

16. The method of claim 13 wherein said programming comprises isolating said external input/output port from said internal input/output port.

17. The method of claim 13 wherein:

one of said external input/output ports is connectable to at least two of said internal input/output ports; and said programming comprises connecting said external input/output port to one of said at least two internal input/output ports.

18. The method of claim 17 wherein said programming comprises connecting said external input/output port to both of said at least two internal input/output ports.

* * * * *